United States Patent
Hanprasopwattana et al.

(10) Patent No.: US 6,716,765 B1
(45) Date of Patent: Apr. 6, 2004

(54) PLASMA CLEAN FOR A SEMICONDUCTOR THIN FILM DEPOSITION CHAMBER

(75) Inventors: Aree Hanprasopwattana, Milpitas, CA (US); Edward J. Augustyniak, Tualatin, OR (US); Jason L. Tian, West Linn, OR (US); Bart J. Van Schravendijk, Sunnyvale, CA (US)

(73) Assignee: Novellus Systems, Inc., San Jose, CA (US)

( * ) Notice: Subject to any disclaimer, the term of this patent is extended or adjusted under 35 U.S.C. 154(b) by 0 days.

(21) Appl. No.: 10/293,662

(22) Filed: Nov. 12, 2002

(51) Int. Cl.[7] .................. H01L 21/302; H01L 21/461
(52) U.S. Cl. .................. 438/714; 438/710; 438/715; 134/1.1; 134/1.2
(58) Field of Search .................. 438/710, 714, 438/715; 134/1.1, 1.2

(56) References Cited

U.S. PATENT DOCUMENTS

| | | | |
|---|---|---|---|
| 5,612,382 A | * 3/1997 | Fike | 514/14 |
| 5,811,356 A | * 9/1998 | Murugesh et al. | 438/711 |
| 5,817,534 A | * 10/1998 | Ye et al. | 438/10 |
| 6,255,222 B1 | * 7/2001 | Xia et al. | 438/710 |
| 6,305,390 B1 | 10/2001 | Jeon | |
| 6,449,521 B1 | * 9/2002 | Gupta | 700/121 |
| 6,482,331 B2 | * 11/2002 | Lu et al. | 216/67 |
| 6,534,007 B1 | * 3/2003 | Blonigan et al. | 422/62 |
| 6,536,449 B1 | * 3/2003 | Ranft et al. | 134/1.1 |
| 2003/0159711 A1 | * 8/2003 | Blonigan et al. | 134/1.2 |

* cited by examiner

Primary Examiner—Alexander Ghyka
(74) Attorney, Agent, or Firm—Roland Tso

(57) ABSTRACT

A method useful for the cleaning of the inner surfaces, including the deposition station or showerhead area of a deposition chamber, are described herein. According to one embodiment of the invention, a fluorine-containing source gas, such as $NF_3$, $SF_6$, or $C_2F_6$, for example, is supplied to the deposition chamber, and energized by a radio frequency to form a plasma that contains fluorine atoms and ions. The radio frequency power is modulated between a maximum value (for a "plasma-ON period") and a minimum value of zero (for a "plasma-OFF period") at a frequency from about 150 Hz to about 50 kHz and a duty cycle of from about 40% to about 90%. The maximum value of RF power may be from about 300 to about 2500 Watts per deposition station or showerhead, and the minimum value is typically zero. The modulated-RF clean process may be conducted in situ after the deposition of a film on wafers, and may be followed by a conventional continuous-RF clean process.

13 Claims, 5 Drawing Sheets

PLASMA CLEAN FOR A SEMICONDUCTOR THIN FILM DEPOSITION CHAMBER

FIELD OF THE INVENTION

The present invention relates to methods of cleaning semiconductor production equipment and particularly to cleaning a chemical vapor deposition chamber.

BACKGROUND OF THE INVENTION

During a semiconductor device fabrication process, chemical vapor deposition (CVD) based on a gaseous reaction is commonly used to deposit a film on the surface of a semiconductor wafer. During the CVD process, reaction products and byproducts deposit not only on the wafer surface but also on the inner surfaces of the chamber. The undesirable deposit on the chamber inner surfaces may adversely affect the quality of the film deposited on the wafer. For example, particles may separate from the inner surfaces of the chamber and contaminate the film, reducing device yield. The deposit may include silicon, oxygen, nitrogen, carbon, and other species, depending on the film deposition chemistry.

Currently, a cleaning method based on plasma etching using a halogen gas (e.g., fluorine) is used to remove the deposit on the inner surface. The plasma etch-based cleaning method entails supplying a gas to the chamber and applying a continuous radio frequency (RF) power to form an RF field inside the chamber. The RF field causes the gas to form a plasma. The plasma products (active molecular, atomic, and ionic species) react with the deposit, cleaning the inner surfaces of the chamber. Ideally, the cleaning should remove all the deposit and return the chamber to the pre-deposition state. The necessary conditions are that (1) all reaction products are volatile and can be readily pumped out from the deposition chamber, and (2) the etching plasma does not react with chamber materials—in other words, chamber materials are corrosion-resistant. In reality, none of these conditions are perfectly satisfied. Some products of film deposit removal may form a solid state residue. Additionally, reactive species in etching plasma may react with the chamber materials, resulting in surface corrosion.

Post-clean residue is often referred to herein as buildup. The amount of buildup on a specific inner surface of the CVD chamber depends on the temperature of the surface and the exposure of the surface to ion bombardment during the plasma clean. Typically, the hotter the surface and the higher the ion flux to the surface, the more buildup is created. One part of a CVD chamber which is particularly sensitive to buildup is a deposition site or station, often a showerhead, that is, a special gas injection system that delivers feedstock gases to the chamber and serves as the RF electrode. High station or showerhead temperature and bombardment of the station or showerhead area by ions in the plasma contribute to station or showerhead buildup.

The quality of the films produced in the chamber degrades with each clean cycle. For example, both the regularity in film thickness among different wafers and the uniformity of the film thickness within a single wafer decrease with each successive clean cycle. The film thickness regularity and uniformity are especially sensitive to buildup on and around the stations or showerheads.

FIG. 1 depicts variations in TEOS (tetraethoxysilane)-based oxide film thickness among wafers processed in a chamber that is cleaned by a continuous-RF plasma-etch method. The closeness in film thickness between different wafers is herein referred to as "film thickness regularity." In the exemplary process depicted in FIG. 1, the chamber is cleaned after every 50 wafers, as indicated by markers 10. At the beginning, the thickness variation is only about 600 Å, from about 17,000 Å to about 17,600 Å. However, the film thickness regularity and the overall film thickness decreases with each successive clean cycle. For example, when 500 or more wafers are processed in the chamber (i.e., wafer #500 and wafer #550), the film thickness drifts to a range from about 16,200 Å to about 17,500 Å. This drift in film thickness indicates not only a general thinning of the film but also an increase in film thickness variation to about 1,300 Å, which is more than twice the initial variation of about 600 Å. The film thickness regularity declines even though the chamber is plasma-cleaned after every 50 wafers.

FIG. 2 depicts variations in TEOS film uniformity within a single wafer processed in a chamber that is cleaned by the continuous-RF plasma-etch method. Film "uniformity," as used herein, indicates how consistent the thickness of a film is within a single wafer. "Deviation," as used herein, refers to the standard deviation divided by an average, and "Percent Deviation", as used herein, refers to Deviation multiplied by 100. The chamber is plasma-cleaned after every 50 wafers, as indicated by markers 20. Initially, for example, from wafer #51 to wafer #200, the film thickness has percent deviation of from about 1.2% to about 1.4% of the average thickness. However, when the chamber is used for 500 or more wafers, for example, from wafer #500 to wafer #550, the percent deviation increases to about 1.8%.

Further development of cleaning processes is desirable.

SUMMARY OF THE INVENTION

The present invention is directed to a method and an apparatus for cleaning the inner surfaces of a deposition chamber, especially in the area of a deposition station, such as a dome-type gas injection system with gas injection tubes, for example, that of the Speed® HDP CVD reactor of Novellus Systems, Inc., a showerhead-type gas injection system, or the like. In accordance with one embodiment, a fluorine-containing source gas, such as $NF_3$ or $C_2F_6$, for example, is supplied to the deposition chamber and radio frequency (RF) power is applied to form an RF field inside the chamber. The RF power is modulated from a maximum value (a "plasma-ON period") to a minimum value (a "plasma-OFF period") at a frequency from about 100 Hz to about 50 kHz. Typically, the modulation frequency is selected from a range of about 1 kHz to about 50 kHz, the most common value being from about 10 kHz to about 50 kHz. The maximum value of the RF power applied to one deposition station or showerhead may be, for example, from about 300 to about 1,500 Watts in case of a system designed to process 200 mm-diameter wafers. In a larger system, such as a system having a CVD chamber designed to process 300 mm-diameter wafers, a higher maximum power, such as from about 500 W to about 2,500 W, may be applied to a single deposition station or showerhead. The minimum value of the RF power is typically zero.

When RF power is applied to the chamber, such as during a plasma-ON period, fluorine atoms and various ions are formed. The fluorine atoms that come to the deposition station or showerhead surface, such as the surface of a dome, a pedestal, a showerhead, or the like, react with and remove the deposit. Ions bombard the station or showerhead surfaces only during the plasma-ON period. Ions bombard the station or showerhead surfaces only during the plasma-ON period. During the plasma-Off period, ion bombardment of station or showerhead surfaces ceases while reactions with fluorine atoms continue. This is because the decay time of charged species, including ions, is much shorter than the decay time of fluorine atoms due to surface reactions.

RF modulation is believed to decrease post-clean buildup by creating a desirable ratio of fluorine atoms to ions inside the chamber. The desirable ratio of fluorine atoms to ions in a modulated RF system is a combined effect of at least two factors, namely, the cessation of ion bombardment during a plasma-OFF period and the continued activity of fluorine atoms during a plasma-OFF period. That is, during a plasma-OFF period, ion bombardment of the showerhead area ceases even though the fluorine atoms formed during a plasma-ON period continue to remove film deposit in the chamber. Thus, including a plasma-OFF period in the clean process results in decreased average ion bombardment and continued flourine atom activity relative to a continuous-RF process having the same average RF power. Therefore, modulation of RF power from a plasma-ON period to a plasma-OFF period results in an overall decreased ion bombardment relative to a continuous-RF process, ultimately leading to a plasma action that cleans the deposition station or showerhead area effectively with reduced or minimal damage to the stations or showerheads.

In the present invention, various parameters, such as chamber pressure and temperature, gas composition, and gas flow rates, may be adjusted to maintain an optimal concentration of fluorine atoms and ions. In general, a high production rate of fluorine atoms and a low ion bombardment are desirable.

The modulated-RF clean process of the present invention achieves superior cleaning results, such as superior cleaning of the deposition station or showerhead area. As buildup on and around the station or showerhead area adversely affects the uniformity and regularity of films deposited on wafers, implementation of the modulated-RF process may result in improved films and may lengthen the life span of a deposition chamber and a deposition station or showerhead. By way of example, implementation of the modulated-RF process may lengthen periods between openings of the chamber to remove deposition station or showerhead buildup via mechanical wiping.

These and other aspects, features, and advantages of the present invention are described in the drawings and the description of the invention set forth below, or will be apparent or appreciated upon consideration thereof.

DETAILED DESCRIPTION

Figure 3:
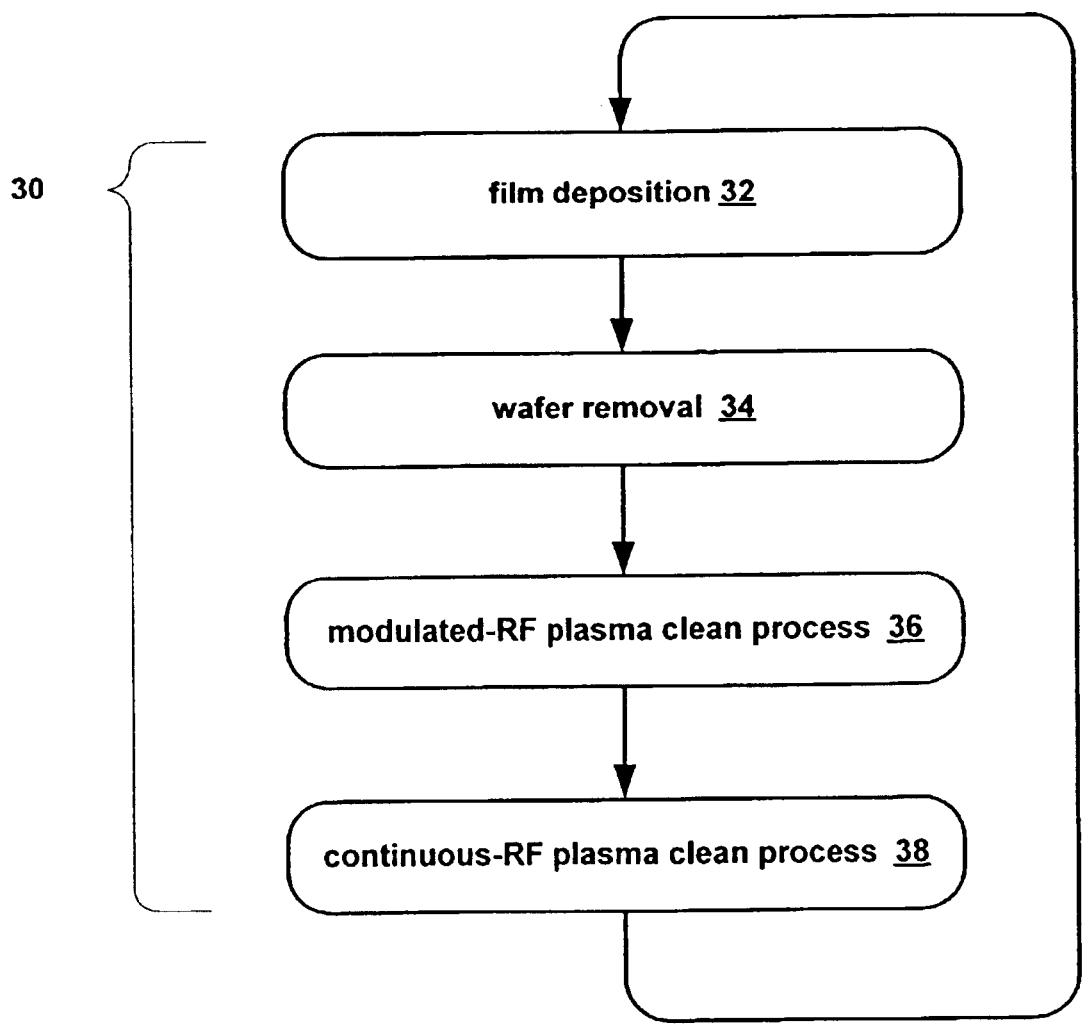
FIG. 3 depicts a deposition and cleaning cycle, in accordance with one embodiment of the present invention.
Figure 4:
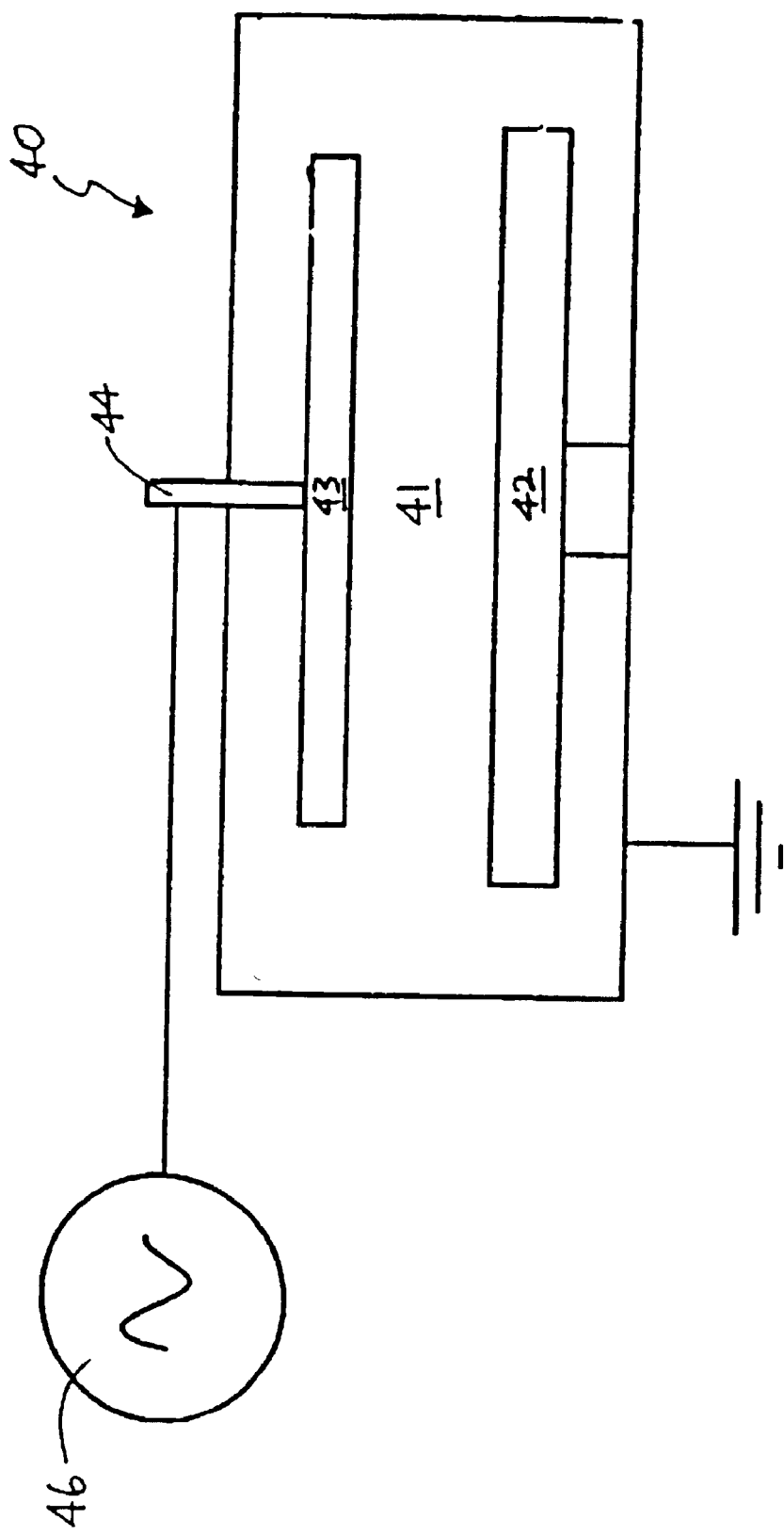
FIG. 4 depicts a radio frequency (RF) plasma reactor that may be used to implement modulated-RF plasma clean process, in accordance with one embodiment of the present invention.

A flow chart of a deposition and clean cycle 30, in accordance with one embodiment of the present invention, is shown in FIG. 3. Deposition and clean cycle 30 includes film deposition 32, wafer removal 34, modulated-RF plasma clean 36, and continuous-RF plasma clean 38. Film deposition 32 may include deposition of a dielectric film, such as a low-k material of a SiOCH-type film, a $SiH_4$-based dielectric material, a TEOS-based dielectric material, SiC (silicon carbide), FSG (flourinated silicon glass), PSG/BPSG (phosphosilicate glass/borophosphosilicate glass), or an ARI, (anti-reflective layer), for example, onto a wafer using any of the well known deposition methods. Wafer removal 34 includes taking the wafers out of the deposition chamber in preparation for the in-situ plasma clean processes of stage 36 and stage 38. Modulated-RF plasma clean process 36, the details of which are provided below, may include an etching process in a plasma-enhanced chemical vapor deposition (PECVD) chamber or a high-density plasma chemical vapor deposition (HDP CVD) chamber. Continuous-RF plasma clean process 38 may include any low-pressure plasma clean process, as may be known in the art. Deposition and clean cycle 30 may be used to deposit and to remove, respectively, any of the dielectric film materials mentioned above and metal films including, for example, TiN, TiN(Si), Ta, and TaN. Another application of a deposition and clean cycle 30 may be used for metal films like tungsten. Deposition and clean cycle 30 may be repeated up to thousands of times through the life span of a chamber.

A radio frequency (RF) plasma reactor 40 that may be used to implement deposition and clean cycle 30, in accordance with one embodiment of the present invention, is shown in FIG. 3. Reactor 40 may be, for example, a Sequel Express™ reactor or a Vector™ reactor of Novellus Systems, Inc. RF plasma reactor 40 includes a chamber 41, inside of which is a platen 42 and deposition station or showerhead area 43. A wafer (not shown) is mounted on platen 42 for film deposition 32 and moved out of chamber 41 during wafer removal 34. Gases are supplied through a gas inlet 44 and distributed into chamber 41 through showerhead area 43. The supplied gas may include a fluorine source such as $NF_3$, $SF_6$, $C_aF_b$, $C_aF_bO_c$, or $C_xH_yF_z$, for example, wherein each of a, b, c, x, y, and z is a positive number, with c being most typically 1. A vacuum pump (not shown) maintains a desired pressure level inside chamber 41. Showerhead area 43 is coupled to RF source 46, which creates an RF field inside chamber 41 so that the gases introduced into chamber 41 form a plasma. The plasma formed in chamber 41 during clean process includes fluorine atoms and ions. The RF source 46 may be any commercially available pulsed generator that is capable of operating in a pulse mode and delivering a high wattage during a pulse, such as an Apex 5 kW, 13.56 MHz pulsed generator.

During modulated-RF clean process 36, the applied instantaneous RF power may be modulated from a maximum value to a minimum value of zero such that power is supplied at the maximum value for a desired fraction of the total modulated-RF clean process time. This desired percentage of the total modulated-RF clean process time during which plasma is on is herein referred to as the "duty cycle," and is typically from about 40% to about 90%.

Figure 5:
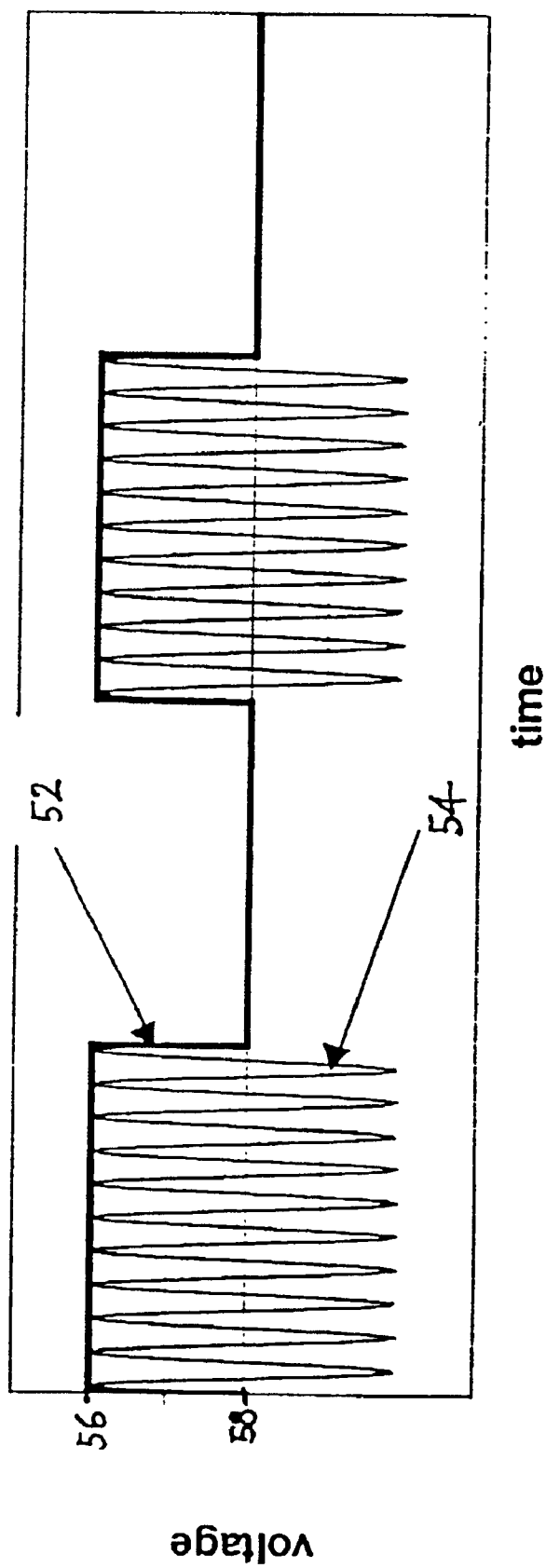
FIG. 5 depicts an RF modulation pattern, in accordance with one embodiment of the present invention.

FIG. 5 depicts an RF modulation pattern in accordance with one embodiment of the present invention. In this embodiment, RF power is delivered at a standard main frequency 54 of about 13.56 MHz, modulated at a frequency 52 from about 150 Hz to about 50 kHz, such as from about 1 kHz or about 10 kHz to about 50 kHz. The modulation of RF power from a maximum value to a minimum value of zero is reflected as fluctuation of showerhead voltage from an upper voltage value 56 to a lower voltage value 58 of zero. Herein, maximum and minimum are simply used to refer to a higher value and a lower value, relative to one another, not to any absolute maximum or minimum such as that afforded by a particular apparatus or such as that needed to obtain absolutely optimum results. The maximum RF power may be from about 300 Watts to about 2,500 Watts per deposition station or showerhead, depending on the system. Examples of maximum RF power include from about 1,000 or about 1,500 Watts to about 2,500 Watts per station or showerhead. The period during which the maximum RF power is applied is herein referred to as a plasma-ON period, and the period during which the minimum RF power of zero is applied is herein referred to as a plasma-OFF period. During a plasma-ON period, plasma is produced, increasing both the concentration of fluorine atoms and the concentration of ions in chamber 41. During a plasma-OFF period, there is still some concentration of fluorine atoms left because they disappear relatively slowly by surface reactions with deposition material. This fluorine can still react with the film in the chamber with virtually no ion bombardment due to the absence of RF power.

The effectiveness of modulated-RF clean process 36 is believed to stem at least partly from the fact that the generation rate of free fluorine atoms during a plasma-ON period is faster than the decay rate of free fluorine by surface reactions. The free fluorine can react with deposited film in the chamber. Ion bombardment is at least partially responsible for the increase of the deposition station or showerhead temperature, which in turn contributes to formation of the buildup on station or showerhead surfaces. During a plasma-OFF period, the fluorine atoms that were formed during a plasma-ON period continue to etch the deposit, However, ion bombardment is at least reduced significantly, eliminating the increase in deposition station or showerhead temperature and formation of the buildup. Thus, by modulating the RF power, the formation of the buildup is decreased. Accordingly, modulation of RF overall achieves an effective decrease in buildup.

When doing comparisons between continuous-RF plasma clean and modulated-RF plasma clean, we assume that the average delivered RF power is the same. For example, a continuous-RF plasma clean running at 1,000 W per deposition station or showerhead will deliver the same power as a modulated-RF process having maximum power of 2,000 W per station or showerhead and a duty cycle of 50% (2,000 W×0.5=1,000 W).

An example of a set of approximate process parameters and values for plasma clean processes of stage 36 and stage 38, in accordance with one embodiment of the present invention, is set forth in Table 1 below.

TABLE 1

| Process Conditions for Plasma Clean | |
|---|---|
| Modulated-RF Clean Process (stage 36) | |
| Total Power (plasma-ON/plasma-OFF) for all six showerheads | 4900 W/0 W |
| NF$_3$ flow rate | 600 sccm |

TABLE 1-continued

| Process Conditions for Plasma Clean | |
|---|---|
| He flow rate | 5000 sccm |
| Temperature | 350° C. |
| Pressure | 3.5 Torr |
| Duty Cycle | 72% |
| Continuous-RF clean process (stage 38) | |
| Total Power for all six showerheads | 2500 W |
| NF$_3$ flowrate | 550 sccm |
| He flow rate | 2000 sccm |
| Temperature | 350° C. |
| Pressure | 0.55 Torr |

The values provided in Table 1 are exemplary. For example, the NF$_3$ flow rate may be from about 200 to about 2,500 standard cubic centimeters per minute (sccm), such as from about 400 to about 1,600 sccm, per six deposition stations or showerheads, and He flow rate may be from about 500 to about 20,000 sccm, such as from about 1,000 to about 15,000 sccm, per six stations or howerheads, and the power may be from about 500 to about 5000 Watts (W) per six stations or showerheads. Further by way of example, the NF$_3$ flow rate may be from about 50 to about 800 sccm, such as from about 100 to about 500 sccm, per station or showerhead, and He flow rate may be from about 150 to about 5,000 sccm, such as from about 250 to about 4,000 sccm, per station or showerhead, and the power may be from about 500 to about 5000 Watts (W) per six stations or showerheads.

For the modulated-RF clean process, the process pressure may be from about 0.7 Torr to about 5 Torr. Process temperature may vary depending on the desired deposition temperature. Typically, deposition and in-situ plasma clean processes occur are carried out at the same temperature, such as from about room temperature to about 500° C. or about 1000° C., typically, from about 200° C. to about 500° C., more typically from about 200° C. to about 450° C., and even more typically from about 350° C. to about 450° C. Process time depends on the type and the amount of buildup. An optical or other end point detector may be used to determine if the chamber is clean so that the clean process can be stopped when the desired amount of cleaning is achieved. Clean times depend on process conditions and on the type and the amount of the deposit that is to be removed from the inner surfaces of the chamber.

Although parameters in Table 1 include NF$_3$ flow rate and He flow rate, these process parameters are illustrative and gases other than NF$_3$ and He may be used. For example, other fluorine-containing gases such as $C_2F_6$, $C_3F_8$, $C_4F_8$, or $C_4F_8O$ may be used. Also, the modulated-RF plasma clean process is not limited to being used with plasma enhanced CVD processes, and may be used with other film deposition processes such as high density plasma CVD (HDP-CVD). The clean process in stages 36 and 38 may be used to remove metal films, such as tungsten, or barrier films, such as TiN, TiN(Si), or TaN, for example, from the chamber surfaces.

The results of a continuous-RF run (Run 1) and two different modulated-RF clean process 36 runs (Run 2 and Run 3), using different sets of parameter values, are set forth in Table 2 below. The total power delivered to the system, here a Sequel Express™ system, was about 3500 W for Run 1(1=3500 W), Run 2 (0.88×4000 W), and Run 3 (0.72×4900 W).

TABLE 2

Results of Deposition and Clean Processes at Different Duty Cycles

| Run No. | Duty cycle (%) and maximum power (W) per 6 showerheads | Remaining showerhead buildup (g) | Relative etch rate (%) | Film uniformity (% deviation) | Wafer-to-wafer thickness variation (Å) |
|---|---|---|---|---|---|
| Run 1 | 100% at 3500 W | 0.67 | 100% | 1.8 | 1305 |
| Run 2 | 88% at 4000 W | 0.58 | 105% | 1.7 | 1100 |
| Run 3 | 72% at 4900 W | 0.37 | 106% | 2.0 | 913 |

Compared to Run 1, which was conducted at a constant RF (i.e., duty cycle=100%), modulated-RF Run 2 and Run 3 showed a slightly higher relative etch rate, i.e., a greater amount of film removed per unit of time, where relative etch rate is defined as the etch rate of any run divided by etch rate for the continuous-RF clean process (Run 1), both determined on the basis of time required for the film removal using the end point detector. The amount of showerhead buildup decreased with the shortening of the duty cycle, being 0.67 g at a 100% duty cycle for Run 1, 0.58 g at a 88% duty cycle for Run 2, and 0.37 g at a 72% duty cycle for Run 3, where the amount of buildup was measured by wiping powder off the showerhead following the plasma clean process and weighing the collected powder. The wafer-to-wafer thickness variation was the least for Run 3, the modulated-RF process with the shortest duty cycle.

Figure 1:
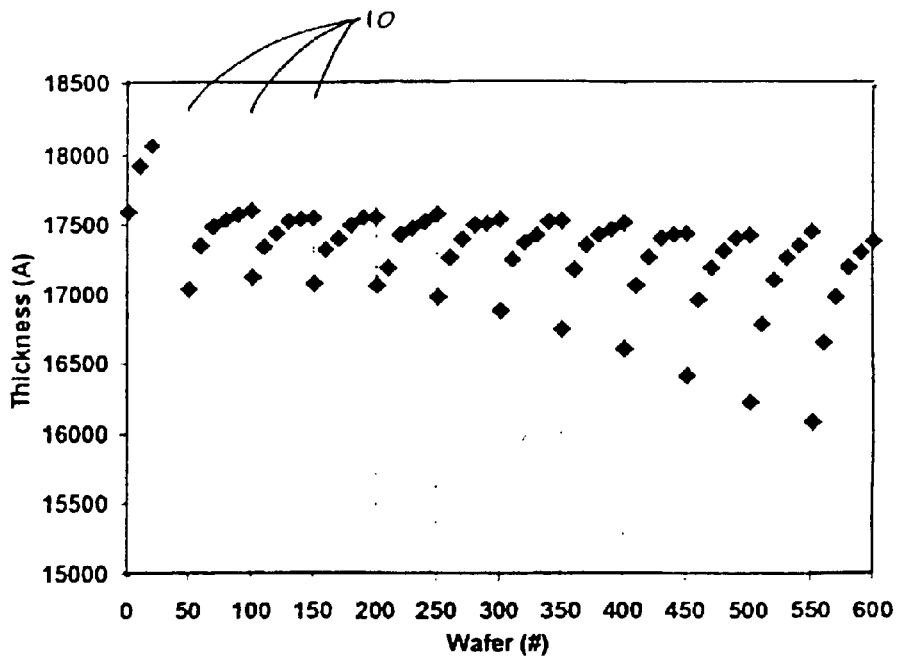
FIG. 1 depicts variations in film thickness among wafers processed in a chamber that is cleaned by a continuous-RF plasma-etch method.
Figure 6:
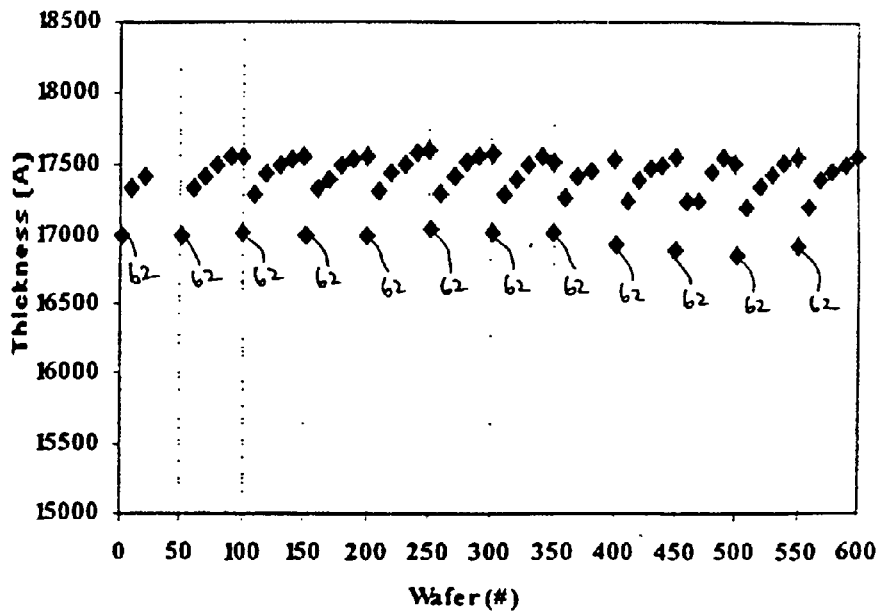
FIG. 6 depicts variations in film for wafers processed in a chamber that is cleaned with modulated RF, in accordance with one embodiment of the present invention.

FIG. 6 depicts the variation in TEOS film for wafers processed in a chamber that is cleaned with modulated RF, in accordance with one embodiment of the present invention. As in FIG. 1, the chamber is cleaned after every 50 wafers. Compared to FIG. 1, which depicts the result of a continuous-RF cleaning process, film thickness regularity is significantly improved. For example, after 500 wafers are processed, the film thickness variation is only 600 Å, from 17,000 Å to about 17,600 Å. The 600 Å variation is a significant improvement over the 1,300 Å variation achieved in a continuous-RF clean process (FIG. 1). Furthermore, as the film thickness is fairly consistent (around 17,000 Å) for the first wafers 62 processed after a clean cycle, the modulated-RF clean process appears to restore the chamber to a state close to the pre-deposition state.

Figure 2:
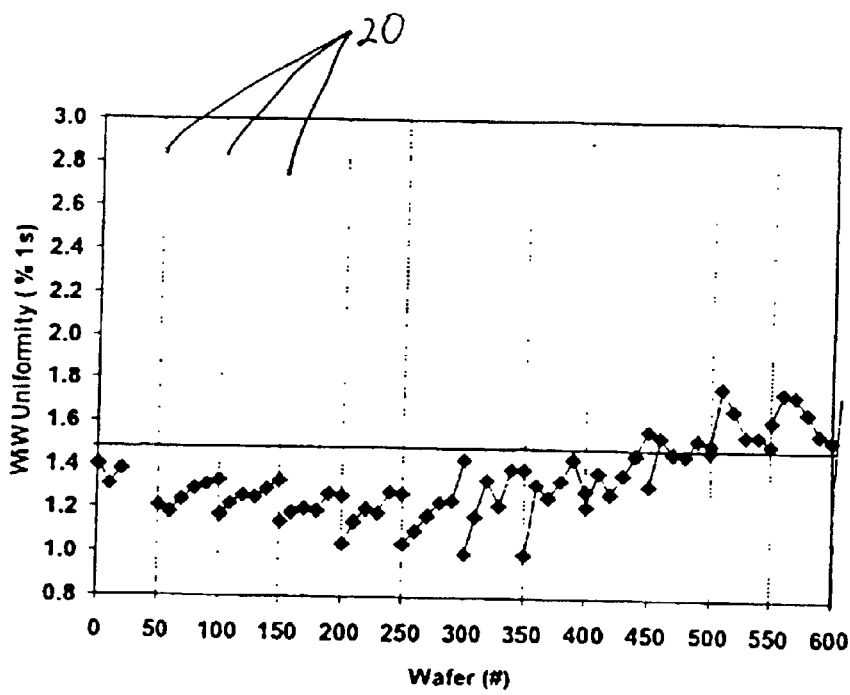
FIG. 2 depicts variations in film uniformity within a single wafer processed in a chamber that is cleaned by the continuous-RF plasma-etch method.
Figure 7:
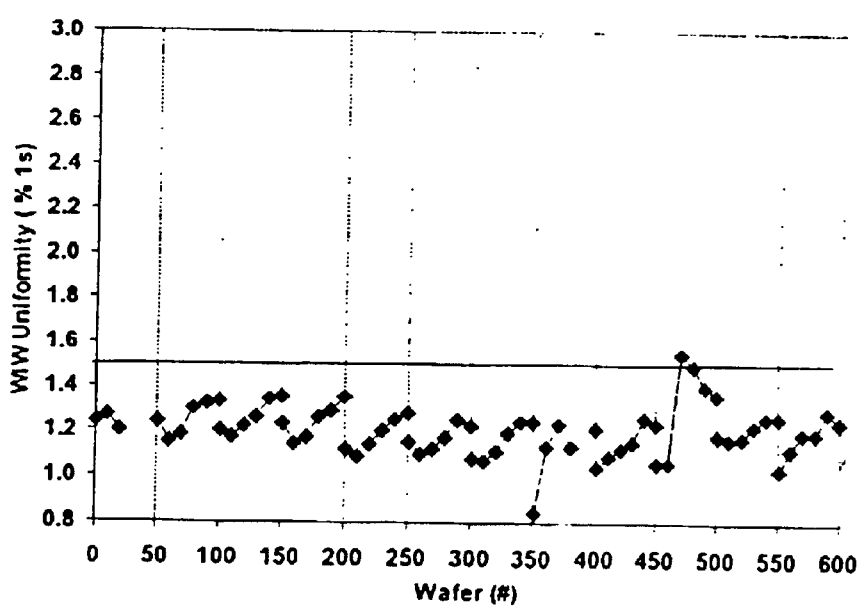
FIG. 7 depicts variations in film uniformity within a single wafer processed in a chamber that is cleaned with modulated RF, in accordance with one embodiment of the present invention.

FIG. 7 depicts variations in film uniformity within a single wafer processed in a chamber that is cleaned with modulated RF, in accordance with one embodiment of the present invention. Comparing FIG. 7 with FIG. 2 indicates that film uniformity is better in a chamber cleaned with RF modulation than in a chamber cleaned with a continuous RF. Compared to the continuous-RF process shown in FIG. 2, which resulted in uniformity variations as high as 1.8% percent deviation, the modulated-RF clean process results in an improved uniformity, with variations being generally less than 1.4% percent deviation.

Although the present invention is described using the above embodiments, the scope of the invention is not limited to the embodiments described. For example, although FIG. 6 and FIG. 7 refer to TEOS-based oxide films, similar improvements have been achieved by RF modulation of plasma clean processes for the etching of silicon nitride (SiN) or silane-based oxide films. Numerous variations and modifications are possible within the scope defined by the following claims.

Further, various aspects and features of the present invention have been explained or described in relation to beliefs or theories, although it will be understood that the invention in not bound to any particular belief or theory. Various modifications of the present invention are possible and/or will be readily apparent to at least those of ordinary skill in the art to which the present invention is directed upon review of the specification. Although the various aspects and features of the present invention have been described with respect to various embodiments and specific examples herein, it will be understood that the invention is entitled to protection within the fill scope of the appended claims.

What is claimed is:

1. A method for cleaning a deposition chamber, comprising:

supplying a fluorine-containing gas into a deposition chamber;

modulating radio frequency power inside the deposition chamber from a first value to zero at a predetermined frequency.

2. The method of claim 1, wherein the predetermined frequency is from about 150 Hz to about approximately 50 kHz.

3. The method of claim 1, wherein the predetermined frequency is from about 1 kHz to about approximately 50 kHz.

4. The method of claim 1, wherein the first value is from about 300 Watts to about 2500 Watts per deposition station in the chamber.

5. The method of claim 1, wherein the first value is from about 1000 Watts to about 2500 Watts per deposition station in the chamber.

6. The method of claim 1, wherein the modulating is at a duty cycle of from about 40 to about 90%.

7. The method of claim 1, wherein prior to the supplying and the modulating, deposition of a film containing a material selected from a group consisting of silicon nitride, silicon dioxide, tetraethoxysilane-based oxide, silicon carbide, fluorinated silicon glass, phosphosilicate glass, borophosphosilicate glass, an antireflective material, a material of low dielectric constant, a SiOCH material, a $SiH_4$-based material, tungsten, TiN, TiN(Si), Ta, and TaN, takes place in the deposition chamber.

8. The method of claim 1, wherein a pressure in the deposition chamber is from about 0.7 Torr to about 5 Torr.

9. The method of claim 1, wherein a temperature in the deposition chamber is from about room temperature to about 1000 degrees Celsius.

10. The method of claim 1, wherein a temperature in the deposition chamber is from about 200 to about 450 degrees Celsius.

11. The method of claim 1, wherein the supplying comprises supplying $NF_3$ at from about 200 to about 2500 standard cubic centimeters per minute and He at from about 500 to about 20,000 standard cubic centimeters per minute.

12. The method of claim 1, wherein the supplying comprises supplying $NF_3$ at from about 400 to about 1600 standard cubic centimeters per minute and He at from about 1000 to about 15,000 standard cubic centimeters per minute.

13. The method of claim 1, wherein the fluorine-containing gas is selected from a group consisting of $NF_3$, $SF_6$, $C_aF_b$, $C_aH_bO_c$ and $C_xH_yF_z$, where each of a, b, c, x, y, and z is a positive number.

* * * * *